(12) United States Patent
Kang

(10) Patent No.: US 7,777,560 B2
(45) Date of Patent: Aug. 17, 2010

(54) INTERNAL VOLTAGE GENERATOR

(75) Inventor: Dong Keum Kang, Cheonan-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 12/220,144

(22) Filed: Jul. 22, 2008

(65) Prior Publication Data
US 2009/0243704 A1    Oct. 1, 2009

(30) Foreign Application Priority Data
Mar. 28, 2008    (KR)   ................ 10-2008-0029353

(51) Int. Cl.
     *G05F 1/10*      (2006.01)
(52) U.S. Cl. ........................ 327/541; 327/83
(58) Field of Classification Search ............... 327/530, 327/534, 535, 537, 538, 540, 541, 77–81, 327/85, 512, 513, 543, 56, 83, 143, 198; 323/312–317; 365/211, 266–269
See application file for complete search history.

(56) References Cited

U.S. PATENT DOCUMENTS

| | | | |
|---|---|---|---|
| 6,297,671 B1 * | 10/2001 | Shih et al. ................ 327/74 |
| 6,791,308 B2 * | 9/2004 | Shim ...................... 323/314 |
| 7,266,031 B2 | 9/2007 | Kim et al. |
| 7,282,989 B2 | 10/2007 | Byeon |
| 7,420,358 B2 * | 9/2008 | Byeon et al. ............. 323/314 |
| 2008/0212362 A1 * | 9/2008 | Choi et al. ................ 365/163 |
| 2009/0080281 A1 * | 3/2009 | Hashiba ............... 365/230.06 |

FOREIGN PATENT DOCUMENTS

KR    10-1996-0038965    11/1996
KR    10-2007-0030474 A    3/2007

* cited by examiner

*Primary Examiner*—Long Nguyen
*Assistant Examiner*—Sibin Chen
(74) *Attorney, Agent, or Firm*—John P. White; Cooper & Dunham LLP

(57) ABSTRACT

An internal voltage generator includes an internal voltage detecting unit that receives an active signal activated in an active operation mode of a semiconductor memory and a bias voltage varying according to temperature variation, detects a level of an internal voltage by using a reference voltage and outputs an internal voltage pumping signal activated according to the level of the internal voltage.

12 Claims, 2 Drawing Sheets

INTERNAL VOLTAGE GENERATOR

TECHNICAL FIELD

This disclosure relates to a semiconductor memory, and, more particularly, to an internal voltage generator.

BACKGROUND

Generally, as semiconductor memory devices become more highly integrated, a cell size inside the semiconductor memory is gradually reduced, and a driving voltage is lowered due to the reduced cell size.

Meanwhile, such a semiconductor memory includes an internal voltage generator to receive a power supply voltage VDD and generate an internal voltage required in the semiconductor memory.

FIG. 1 is a circuit diagram showing an internal voltage generator according to the related art. Particularly, the internal voltage generator generates an internal voltage VPP used in word lines of a memory cell by raising the power supply voltage VDD.

As shown in FIG. 1, the internal voltage (VPP) generator according to the related art includes an internal voltage detecting unit 100, which detects the level of the internal voltage VPP to output an internal voltage pumping signal Vpump_on, a reference voltage generating unit 200, which generates a reference voltage Vref for the internal voltage VPP, and an internal voltage generating unit 300, which pumps the internal voltage VPP according to the internal voltage pumping signal Vpump_on. The internal voltage detector 100 includes a differential amplifier to operate by comparing a voltage Vsens, which is generated by detecting the level of the internal voltage VPP, and the reference voltage Vref.

In the differential amplifier of the internal voltage detector 100, if a semiconductor memory is in an active operation mode, a first current sink unit NM1 is turned on in response to an active signal ACT to form a current path. In addition, if the semiconductor memory is in a stand-by operation mode, a second current sink unit NM2 is turned on in response to the reference voltage Vref to form a current path. Generally, the second current sink unit NM2 includes a transistor having a channel longer than that of a transistor of the first current sink unit NM1 in order to reduce current consumption.

Hereinafter, the operation of the internal voltage generator having the above structure according to the related art will be described.

As shown in FIG. 1, the internal voltage detector 100 detects the level of the internal voltage VPP, and compares the detected voltage Vsens with the reference voltage Vref.

In this case, if the detected voltage Vsense is smaller than the reference voltage Vref, a transistor NM4 is open more than a transistor NM3, so that a signal of a node A becomes a low level, and the internal voltage pumping signal Vpump_on becomes a high level. Thus, the internal voltage generating unit 300 generates the internal voltage VPP in response to the internal voltage pumping signal Vpump_on having a high level.

In contrast, if the detected voltage Vsense is greater than the reference voltage Vref, the transistor NM3 is opened more than the transistor NM4, so that a signal of a node B becomes a low level, and the signal of the node A becomes a high level. Accordingly, the internal voltage pumping signal Vpump_on becomes a low level, so that the internal voltage generating unit 300 is stopped.

Meanwhile, if such an internal voltage generator according to the related art is in an active operation mode under a cold temperature, the first current sink unit NM1 is turned on so that the differential amplifier smoothly operates. However, if the internal voltage generator is in a stand-by operation mode, the threshold voltage of the second sync unit NM2 rises so that the differential amplifier does not operate smoothly. Accordingly, the internal voltage detecting unit 100 erroneously operates to be failed.

Even if the level of the internal voltage VPP becomes a high level, such an erroneous operation of the internal voltage detecting unit 100 continuously operates the internal voltage generating unit 300 without stopping the internal voltage generating unit 300, so that excessive current consumption occurs.

SUMMARY

In an aspect of the present disclosure, an internal voltage generator is provided that is capable of stably detecting the level of an internal voltage in a stand-by operation mode even if a temperature is changed.

In another aspect of the present disclosure, an internal voltage generator is provided that is capable of compensating for a current driving capability according to temperature variation in a stand-by operation mode.

In an embodiment, an internal voltage generator includes an internal voltage detecting unit configured to receive an active signal activated in an active operation mode of a semiconductor memory and a bias voltage varying according to temperature variation, detect a level of an internal voltage by using a reference voltage and output an internal voltage pumping signal activated according to the level of the internal voltage.

In another embodiment, an internal voltage generator includes a temperature detecting unit configured to receive a reference voltage having a predetermined level and output a bias voltage varying according to temperature variation, and an internal voltage detecting unit configured to receive an active signal activated in an active operation mode of a semiconductor memory and the bias voltage, detect a level of an internal voltage by using the reference voltage and output an internal voltage pumping signal activated according to the level of the internal voltage.

In another exemplary embodiment, an internal voltage generator includes a reference voltage generator configured to generate a reference voltage having a predetermined voltage level, a temperature detecting unit configured to receive the reference voltage and output a bias voltage varying according to temperature variation, an internal voltage detecting unit configured to receive an active signal activated in an active operation mode of a semiconductor memory and the bias voltage, detect a level of an internal voltage by using the reference voltage and output an internal voltage pumping signal activated according to the level of the internal voltage, and an internal voltage generator configured to generate the internal voltage according to the internal voltage pumping signal.

In still another exemplary embodiment, an internal voltage generator includes an internal voltage detecting unit configured to detect a level of an internal voltage by using a reference voltage, and output an internal voltage pumping signal activated according to the level of the internal voltage, and a current compensating unit configured to receive the reference voltage and output a bias voltage compensating for a current driving capability of the internal voltage detecting unit in a stand-by operation mode of a semiconductor memory.

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION OF THE PREFERRED EMBODIMENTS

Hereinafter, examples and exemplary embodiments of the present invention will be described with reference to accompanying drawings. However, the embodiments are for illustrative purposes only and are not intend to limit the scope of the invention and the claims appended hereto.

Figure 1:
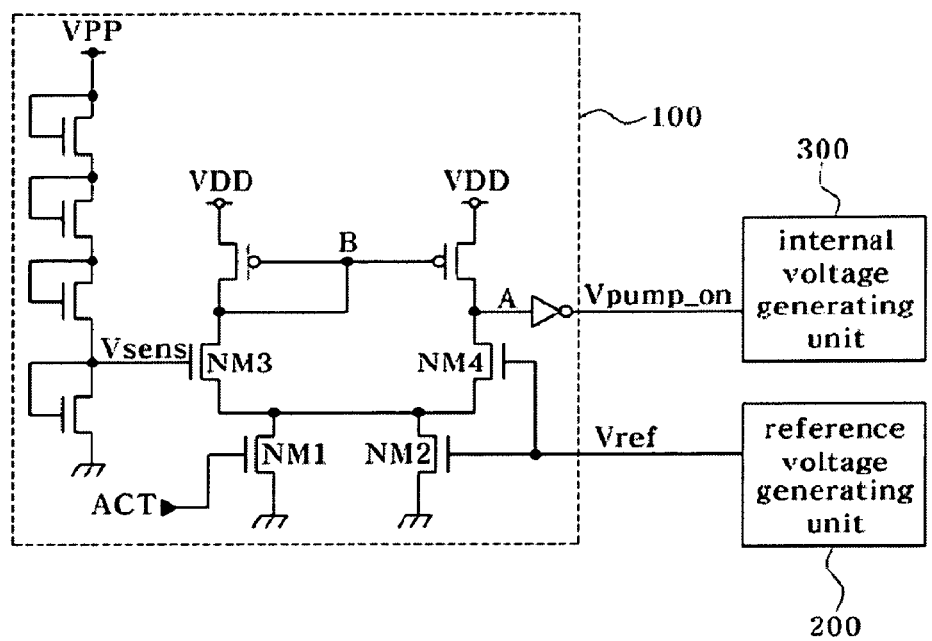
FIG. 1 is a circuit diagram showing an internal voltage generator according to the related art.
Figure 2:
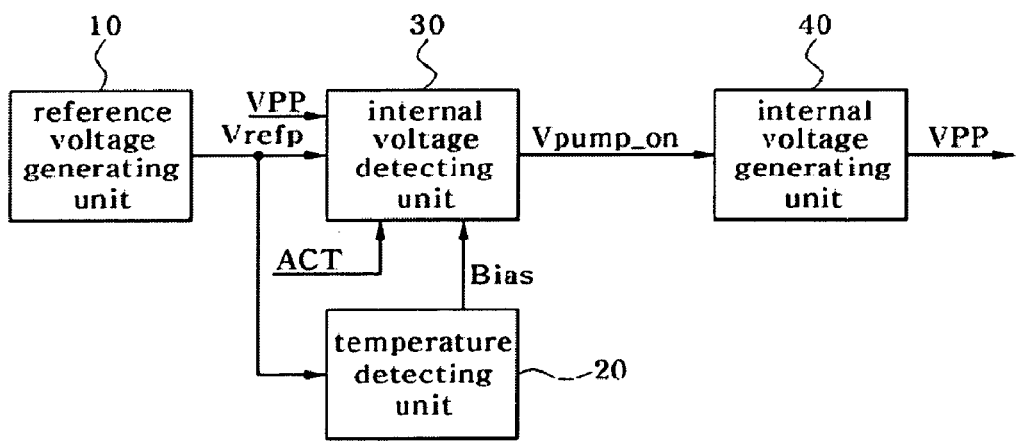
FIG. 2 is a block diagram showing an internal voltage generator according to an embodiment of this disclosure.

FIG. 2 is a block diagram showing an internal voltage generator according to an embodiment of this disclosure. Particularly, the internal voltage generator generates an internal voltage VPP used in word lines of a memory cell by raising a power supply voltage VDD.

As shown in FIG. 2, the internal voltage generator according to the embodiment of this disclosure includes a reference voltage generating unit 10, a temperature detecting unit 20, an internal voltage detecting unit 30, and an internal voltage generating unit 40. The reference voltage generating unit 10 generates a reference voltage Vrefp having a predetermined level. The temperature detecting unit 20 receives the reference voltage Vrefp and outputs a bias voltage varying according to temperature variation. The internal voltage detecting unit 30 receives an active signal ACT activated in an active operation mode of a semiconductor memory and the bias voltage, compares the level of the reference voltage Vrefp with the level of an internal voltage VPP, and outputs an internal voltage pumping signal Vpump_on activated according to the comparison result. The internal voltage generating unit 40 generates the internal voltage VPP according to the internal voltage pumping signal Vpump_on.

Figure 3:
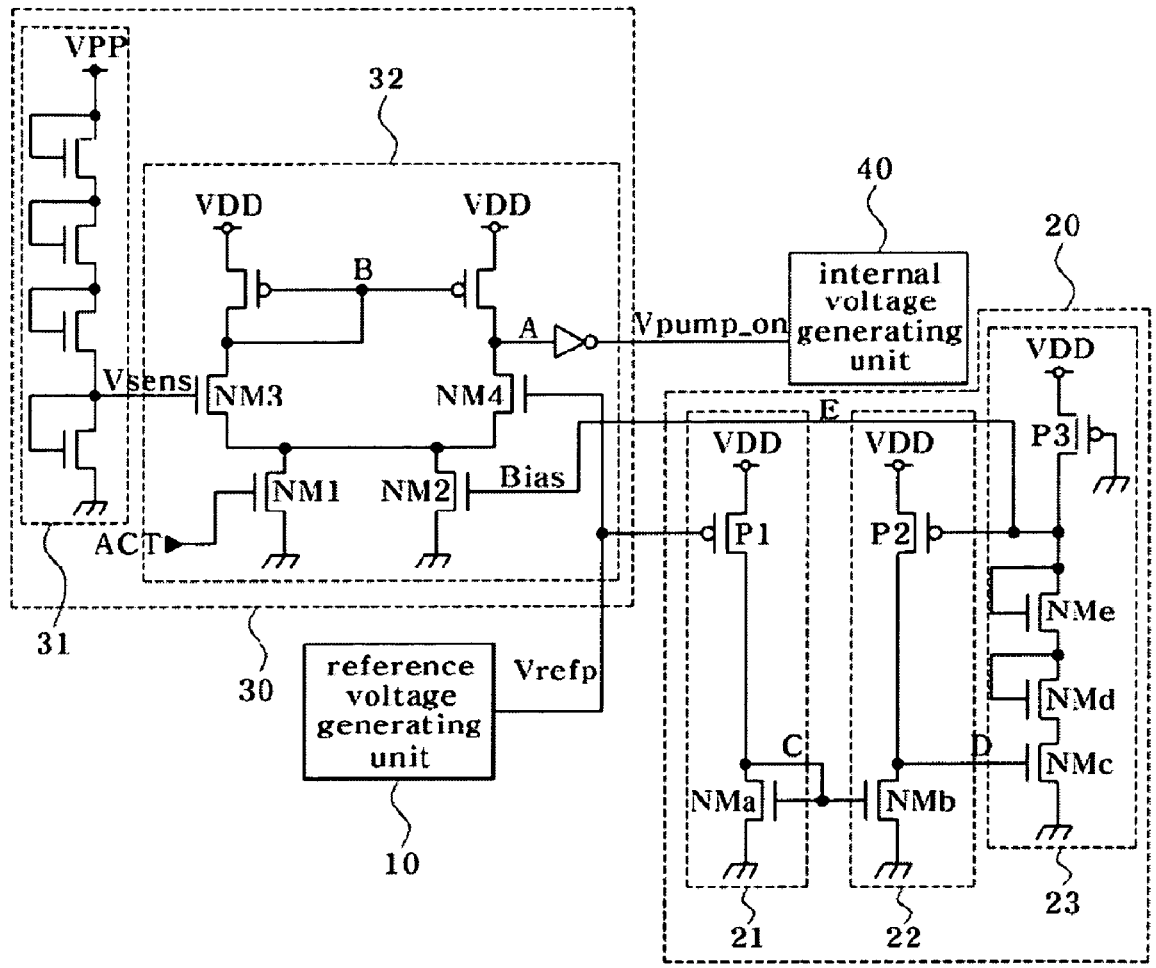
FIG. 3 is a circuit diagram showing the internal voltage generator shown in FIG. 2.

FIG. 3 is a circuit diagram showing the internal voltage generator shown in FIG. 2.

As shown in FIG. 3, the temperature detecting unit 20 includes a first detection portion 21, a second detection portion 22, and a third detection portion 23. The first detection portion 21 receives a current in response to the reference voltage Vrefp and output a first voltage (node C) varying according to temperature variation. The second detection portion 22 receives a current in response to the bias voltage, and outputs a second voltage (node D) varying according to temperature variation in response to the first voltage (node C). The third detection portion 23 receives a current in response to a grounding voltage VSS and outputs the bias voltage varying according to temperature variation in response to the second voltage (node D).

The reference voltage Vrefp has a predetermined level in order to generate the internal voltage VPP.

The first detection portion 21 includes a first PMOS driver Pt, which supplies a current in response to the reference voltage Vrefp, and a first NMOS diode NMa, which receives the current from the first PMOS driver Pt to have the electric potential of the first voltage (node C).

The second detection portion 22 includes a second PMOS driver P2, which supplies a current in response to the bias voltage, and a first NMOS driver NMb, which receives the current from the second PMOS driver P2, and outputs the second voltage (node D) in response to the first voltage (node C).

The third detection portion 23 includes a third PMOS driver P3, which receives a current in response to the grounding voltage VSS, a second NMOS driver NMc, which receives the current from the third PMOS driver P3, and is driven in response to the second voltage (node D), and a plurality of second NMOS diodes NMd and NMe, which are connected to each other in series between the third PMOS driver P3 and the second NMOS driver NMc and have the electric potential of the bias voltage.

As shown in FIG. 3, the internal voltage detecting unit 30 includes a voltage level detecting unit 31 and a comparison unit 32. The voltage level detecting unit 31 detects the level of the internal voltage VPP. The comparison unit 32 compares the voltage level of the output signal Vsens of the voltage level detecting unit 31 with the level of the reference voltage Vrefp.

The voltage level detecting unit 31 includes a plurality of NMOS diodes connected to each other in series between the internal voltage VPP and the grounding voltage VSS, and outputs the signal Vsens obtained by dividing the level of the internal voltage VPP.

The comparison unit 32 includes a differential amplifier, and includes a first current sink unit NM1 driven in response to the active signal ACT and a second current sink unit NM2 driven in response to the bias signal. Such a comparison unit 32 is activated when the active signal ACT is received in an active operation mode, and is activated when the bias voltage is received in a stand-by operation mode.

The first current sink unit NM1 includes a first NMOS transistor, and the second current sink unit NM2 includes a second NMOS transistor. The second NMOS transistor has a channel longer than that of the first NMOS transistor.

Figure 4:
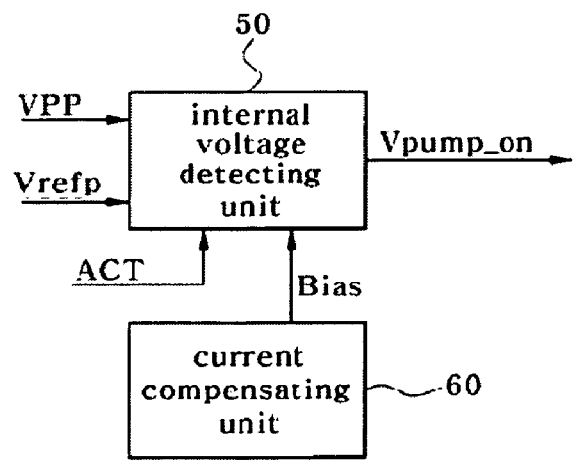
FIG. 4 is a block diagram showing an internal voltage generator according to another embodiment of this disclosure.

FIG. 4 is a block diagram showing an internal voltage generator according to another embodiment of this disclosure.

As shown in FIG. 4, the internal voltage generator according to the second exemplary embodiment of this disclosure includes an internal voltage detecting unit 50 and a current compensating unit 60. The internal voltage detecting unit 50 detects the level of an internal voltage VPP by using a reference voltage Vrefp, and outputs an internal voltage pumping signal Vpump_on activated according to the level of the internal voltage VP. The current compensating unit 60 receives the reference voltage Vrefp, and outputs a bias voltage used to compensating for a current driving capability of the internal voltage detecting unit 50 in a stand-by operation mode of a semiconductor memory.

The internal voltage detecting unit 50 and the current compensating unit 60 have the same circuit structure as those of the internal voltage detecting unit 30 and the temperature detecting unit 20 of the first embodiment of this disclosure.

Hereinafter, operation of the internal voltage generator having the above-mentioned structure will be described. Particularly, the description will be made in relation to operation of the above semiconductor memory when the semiconductor memory is in a stand-by operation mode under a lower temperature or a high temperature.

If the semiconductor memory is in stand-by operation mode under a low temperature, the temperature detecting unit 20 receives a current in response to the reference voltage Vrefp having a predetermined level in order to generate the internal voltage VPP and outputs the first voltage (node C) varying according to temperature variation.

In this case, the threshold voltage Vt of the first NMOS diode NMa is raised, so that the electric potential of the first voltage (node C) is raised, and the electric potential of the second voltage (node D) is dropped due to the rise of the first voltage (node C).

The electric potential of the bias voltage (node E) is raised due to the rise of the threshold voltage Vt of the second NMOS diodes NMd and NMe, which are connected to each other in series, and the drop of the first voltage (node D).

In contrast, if the semiconductor memory is in stand-by operation mode under a high temperature, the electric potential of the first voltage (node C) is dropped due to the drop of the threshold voltage Vt of the first NMOS diode NMa, and the electric potential of the second voltage (node D) is raised due to the drop of the first voltage (node C).

The electric potential of the bias voltage (node E) is dropped due to the drop of the threshold voltage Vt of the second NMOS diodes NMd and NMe, which are connected to each other in series, and the rise of the first voltage (node D).

In other words, if a temperature is lowered, the temperature detecting unit 20 raises and outputs the bias voltage by using the threshold voltage of a MOS transistor varying according to temperature variation. If the temperature is raised, the temperature detecting unit 20 drops and outputs the bias voltage.

The internal voltage detecting unit 30 compensates for an inferior current driving capability, which is caused by the rise of the threshold voltage of the second current sink unit NM2, by raising the bias voltage in the stand-by operation mode under a low temperature. Accordingly, the internal voltage detecting unit 30 can be stably operated.

Meanwhile, if the semiconductor memory is in an active operation mode, the internal voltage detecting unit 30 may operate by forming a current path through the first current sink unit NM1 having a channel shorter than that of the second current sink unit NM2 in response to the active signal ACT. Such an operation of the internal voltage detecting unit 30 is identical to that of the conventional internal voltage detecting unit.

As described above, according to the above described exemplary embodiments of the present invention, a current driving capability is compensated even under a low temperature condition, so that the level of the internal voltage can be stably detected.

Although embodiments of the present invention have been described for illustrative purposes, those skilled in the art will appreciate that various modifications, additions and substitutions are possible, without departing from the scope and spirit of the disclosure and the appended claims.

The present disclosure claims priority to Korean application 10-2008-0029353, filed on Mar. 28, 2008, the entire contents of which are incorporated herein by reference.

What is claimed is:

1. An internal voltage generator comprising:
    a temperature detecting unit configured to receive a reference voltage having a predetermined level and output a bias voltage varying according to temperature variation; and
    an internal voltage detecting unit configured to compare an internal voltage with the reference voltage, and output an internal voltage pumping signal according to the comparison result;
    a first enabling unit configured to enable the internal voltage detecting unit in response to an active signal activated in an active operation mode of a semiconductor memory device; and
    a second enabling unit configured to enable the internal voltage detecting unit in response to the bias voltage, and compensate a current driving capability of the internal voltage detecting unit in response to the bias voltage when the semiconductor memory device enters a stand-by operation mode.

2. The internal voltage generator of claim 1, wherein the temperature detecting unit receives a current in response to the reference voltage, and outputs the bias voltage, wherein the bias voltage is raised when a temperature becomes lowered and the bias voltage is lowered when the temperature becomes increased, by using a threshold voltage of a MOS transistor varying according to temperature variation.

3. The internal voltage generator of claim 1, wherein the temperature detecting unit includes:
    a first detection portion configured to receive a current in response to the reference voltage and output a first voltage varying according to temperature variation;
    a second detection portion configured to receive a current in response to the bias voltage, and output a second voltage varying according to temperature variation in response to the first voltage; and
    a third detection portion configured to receive a current in response to a grounding voltage and output the bias voltage varying according to temperature variation in response to the second voltage.

4. The internal voltage generator of claim 3, wherein the first detection portion includes:
    a first PMOS driver configured to supply a current in response to the reference voltage; and
    a first NMOS diode configured to receive the current from the first PMOS driver to have electric potential of the first voltage, wherein the second detection portion includes:
    a second PMOS driver configured to supply a current in response to the bias voltage; and
    a first NMOS driver configured to receive the current from the second PMOS driver and output the second voltage in response to the first voltage, and wherein the third detection portion includes:
    a third PMOS driver configured to supply a current in response to the grounding voltage;
    a second NMOS driver configured to receive the current from the third PMOS driver, and to be driven in response to the second voltage; and
    a plurality of second NMOS diodes connected to each other in series between the third PMOS driver and the second NMOS driver.

5. The internal voltage generator of claim 1, wherein the internal voltage detecting unit includes:
    a voltage level detecting unit configured to detect the level of the internal voltage by using a plurality of NMOS diodes connected to each other in series between the internal voltage and a grounding voltage; and
    a comparison unit configured to, compare a voltage level of an output signal of the voltage level detecting unit with a level of the reference voltage.

6. The internal voltage generator of claim 1, wherein the first enabling unit includes a first NMOS transistor, the second enabling unit includes a second NMOS transistor, and the second NMOS transistor has a channel longer than a channel of the first NMOS transistor.

7. An internal voltage generator comprising:

a reference voltage generator configured to generate a reference voltage having a predetermined voltage level;

a temperature detecting unit configured to receive the reference voltage and output a bias voltage varying according to temperature variation;

an internal voltage detecting unit configured to compare an internal voltage with the reference voltage, and output an internal voltage pumping signal according to the comparison result;

a first enabling unit configured to enable the internal voltage detecting unit in response to an active signal activated in an active operation mode of a semiconductor memory device;

a second enabling unit configured to enable the internal voltage detecting unit in response to the bias voltage, and compensate a current driving capability of the internal voltage detecting unit in response to the bias voltage when the semiconductor memory device enters a standby operation mode; and an internal voltage generator configured to generate the internal voltage according to the internal voltage pumping signal.

8. The internal voltage generator of claim 7, wherein the temperature detecting unit receives a current in response to the reference voltage, and outputs the bias voltage, wherein the bias voltage is raised when a temperature becomes lowered and the bias voltage is lowered when the temperature becomes increased, by using a threshold voltage of a MOS transistor varying according to temperature variation.

9. The internal voltage generator of claim 7, wherein the temperature detecting unit includes:

a first detection portion configured to receive a current in response to the reference voltage and output a first voltage varying according to temperature variation;

a second detection portion configured to receive a current in response to the bias voltage, and output a second voltage varying according to temperature variation in response to the first voltage; and a third detection portion configured to receive a current in response to a grounding voltage and output the bias voltage varying according to temperature variation in response to the second voltage.

10. The internal voltage generator of claim 9, wherein the first detection portion includes:

a first PMOS driver configured to supply a current in response to the reference voltage;

a first NMOS diode configured to receive the current from the first PMOS driver and to have electric potential of the first voltage, wherein the second detection portion includes:

a second PMOS driver configured to supply a current in response to the bias voltage; and a first NMOS driver configured to receive the current from the second PMOS driver and output the second voltage in response to the first voltage, and wherein the third detection portion includes:

a third PMOS driver configured to supply a current in response to the grounding voltage;

a second NMOS driver configured to receive the current from the third PMOS driver, and to be driven in response to the second voltage; and a plurality of second NMOS diodes connected to each other in series between the third PMOS driver and the second NMOS driver.

11. The internal voltage generator of claim 7, wherein the internal voltage detecting unit includes:

a voltage level detecting unit configured to detect the level of the internal voltage by using a plurality of NMOS diodes connected to each other in series between the internal voltage and a grounding voltage; and a comparison unit configured to compare a voltage level of an output signal of the voltage level detecting unit with a level of the reference voltage.

12. The internal voltage generator of claim 11, wherein the first enabling unit includes a first NMOS transistor, the second enabling unit includes a second NMOS transistor, and the second NMOS transistor has a channel longer than a channel of the first NMOS transistor.

* * * * *